(12) United States Patent
Chiba

(10) Patent No.: US 6,449,332 B1
(45) Date of Patent: Sep. 10, 2002

(54) EXPOSURE APPARATUS, AND DEVICE MANUFACTURING METHOD

(75) Inventor: Keiko Chiba, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/538,302

(22) Filed: Mar. 30, 2000

(30) Foreign Application Priority Data

Mar. 31, 1999 (JP) .......................................... 11-093523

(51) Int. Cl.[7] .................................................. G21K 5/00
(52) U.S. Cl. ...................................... 378/34; 250/492.2
(58) Field of Search .......................... 378/34; 250/492.2

(56) References Cited

U.S. PATENT DOCUMENTS

| 4,677,042 A | 6/1987 | Kato et al. ...................... 430/5 |
| 4,735,877 A | 4/1988 | Kato et al. ...................... 430/5 |
| 4,837,123 A | 6/1989 | Kato et al. .................... 430/269 |
| 5,422,921 A | 6/1995 | Chiba ........................... 378/34 |
| 5,553,110 A | 9/1996 | Sentoku et al. ................ 378/35 |
| 5,781,607 A | 7/1998 | Acosta et al. .................. 378/34 |
| 5,792,578 A | 8/1998 | Tzu et al. ....................... 430/5 |
| 5,793,836 A | 8/1998 | Maldonado et al. .......... 378/35 |
| 5,809,103 A | 9/1998 | Smith et al. ................... 378/35 |
| 5,928,813 A | 7/1999 | Krivokapic et al. ........... 430/5 |
| 5,952,149 A | 9/1999 | Sakai et al. ............... 430/270.1 |

FOREIGN PATENT DOCUMENTS

| JP | 10-125583 | 5/1998 |
| JP | 11-109608 | 4/1999 |

*Primary Examiner*—Craig E. Church
(74) *Attorney, Agent, or Firm*—Fitzpatrick, Cella, Harper & Scinto

(57) ABSTRACT

An exposure apparatus including an exposure system for executing an exposure operation by use of an exposure beam to transfer a pattern of a mask onto a substrate, the mask having a photocatalyst portion, an auxiliary space for irradiating, therewithin, the mask with an auxiliary radiation different from the exposure beam to accelerate photocatalytic reaction of the photocatalyst portion, and a humidity control system for controlling humidity inside the auxiliary space.

25 Claims, 9 Drawing Sheets

EXPOSURE APPARATUS, AND DEVICE MANUFACTURING METHOD

FIELD OF THE INVENTION AND RELATED ART

This invention relates to an exposure apparatus for forming a desired pattern on a substrate such as a semiconductor substrate, for example, and also to a device manufacturing method using the same.

In the manufacture of devices with fine patterns, such as semiconductor devices (e.g., semiconductor integrated circuits), micromachines or thin film magnetic heads, for example, generally, light (visible light or ultraviolet light) or X-rays are projected through a mask to a substrate (workpiece to be exposed) by which a desired pattern is transferred onto the substrate. In the case of semiconductor integrated circuits, for example, a mask corresponding to a desired pattern is prepared and it is placed relative to a semiconductor substrate having a resist coating formed thereon. Then, light or X-rays are projected to the substrate through the mask, by which the resist material is selectively exposed to light, such that a circuit pattern is selectively exposed to light, such that a circuit pattern is transferred to the resist. Subsequently, through an etching process and a film formation process, for example, a desired circuit is produced on the semiconductor substrate. Taking the case of semiconductor integrated circuit manufacture as an example, production of a device having a very fine pattern such as described above, will be explained below.

The density and speed of such semiconductor integrated circuits are increasing more and more, and the linewidth of a pattern for the integrated circuit is narrowed more and more. In order to meet this, further improvements in the performance of semiconductor manufacturing methods are required. As regards printing apparatuses (exposure apparatuses), steppers which use an exposure light source of shorter wavelengths such as KrF excimer laser (248 nm), an ArF excimer laser (193 nm), or an X-ray region (0.2–15 nm), have been developed.

As regards a resist material to be used for the transfer of a desired resist to a substrate, on the other hand, a chemical amplification (intensifying) type resist using an acid catalyst has been developed.

With the narrowing of a linewidth of a desired pattern, dust-proofing measures become very difficult to accomplish. Not only does the limit to the size or number of dust particles become strict, but also the sensitivity of processes to chemical matters becomes higher. In a clean room in which semiconductor integrated circuits are produced, chemical contamination becomes a critical problem. This is attributable to decomposition products of a resist, scattered matters produced during a process such as development or washing, for example, or volatile matters generated from an adhesive agent or wall materials, for example.

When, in such a chemical environment, the exposure process using short wavelength light such as deep ultraviolet light or X-rays is performed for a long period, it causes contamination of the mask surface, that is, deposition of matters on the mask surface, which in turn causes a change in the light transmissivity, reflectivity or scatter characteristic of the mask. Particularly, when a chemical amplification type resist is used, an oxygen generating agent or acid and decomposition products are evaporated during the exposure process or after it, and contamination of the mask is accelerated.

FIG. 11 shows a reaction example of a chemical amplification type resist. A t-Boc (tertiary-butoxy carbonyl) group contained in the resist as an anti-dissolution agent is decomposed, whereby volatile butene is produced.

In an X-ray projection exposure process, a mask and a workpiece are exposed while a small gap of about several tens of microns is held therebetween. Therefore, contamination of the mask is a very serious problem. Depositions may have various shapes and compositions. While a certain tendency may be found, a definite casual relationship is not detected. It may be considered that the deposition is not based on a simple photochemical reaction but it results from complex functions of decomposition, recombination, multiple reaction, sediment, or crystallization, for example. If deposition is produced, it may be removed by washing. However, particularly in a case of an X-ray mask, washing is very difficult to do because the shape of an absorptive material has a high aspect. Practically, therefore, all of the dust particles cannot be removed by washing. Since, on the other hand, the supporting film comprises a very thin film, the strength is very low. Therefore, the washing operation could not be done frequently.

If the exposure process is repeated while mask surface contamination by dust or any other deposition is left there, a transferred pattern is influenced largely due to a reduction alignment light transmissivity and degradation of alignment precision, for example.

SUMMARY OF THE INVENTION

It is an object of the present invention to provide an exposure apparatus by which deposition or sediment of contaminants upon a mask surface can be prevented, to reduce or remove the necessity of mask washing operations and to prolong the lifetime of the mask.

It is another object of the present invention to provide an exposure apparatus by which degradation of exposure precision due to contamination of a mark surface can be prevented.

It is a further object of the present invention to provide a mask structure usable in such an exposure apparatus, an exposure method, a semiconductor device or a semiconductor device manufacturing method.

In accordance with investigations made by the inventors in regard to prevention of deposition or sediment of contaminants upon a mask surface, it has been found that contamination can be avoided by the following structure:

In an exposure apparatus for transferring a desired pattern formed on a mask structure onto a workpiece through an exposure process, the mask structure has a photocatalyst provided at least in a portion thereof, and an auxiliary chamber is defined therein for irradiating the mask structure with auxiliary light. The humidity in the auxiliary chamber may preferably be controlled.

A representative function of a photocatalyst is that various matters are schematically decomposed in response to irradiation of short wavelength light such as ultraviolet rays or X-rays. Further, it has an effect as that of a photosemiconductor, and it is brought into a conductive state in response to irradiation with light, providing an anti-electrification function. Thus, it shows a function for preventing deposition of contaminants.

When the contamination of a mask reaches a certain level, the decomposition action may be accelerated in the auxiliary chamber. The auxiliary chamber may be controlled independently from an exposure ambience, and a light source and an environment best suited to the photocatalytic reaction may be prepared there. The auxiliary chamber may be provided with an exhaust port, for discharging decomposition products and for preventing redeposition of the same. This effectively increases the deposition decomposition action.

With the structure described above, the frequency of mask washing operation can be reduced, or the necessity of itself may be removed. Thus, the lifetime of the mask can be prolonged significantly.

In order that a photocatalyst functions as a catalyst, because of the band gap of the material thereof, it needs a large energy (short wavelength light) higher than a certain energy. However, if a metal is ion-injected, an absorptive band to light of longer wavelengths is produced, such that, with that absorptive band, a photocatalytic function is provided. Titanium oxide, which is a representative photocatalyst, absorbs light of wavelengths lower than 380 nm and produces a photocatalytic action. When Cr or V is ion-injected to the titanium oxide, while it depends on the amount of injection, light of longer wavelengths of about 450 nm can be used.

When a desired pattern is transferred to a workpiece in accordance with the present invention, the influence which otherwise might result from non-uniformness of exposure or insufficient control of exposure amount, due to contamination of a mask, or from degradation of alignment precision due to reduced alignment light transmissivity of the mask, can be avoided satisfactorily. Therefore, high precision printing can be done in mass production. Also, by printing a desired pattern on a workpiece in accordance with the present invention and then by processing the workpiece, high performance semiconductor devices can be produced, in mass production.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

EXAMPLE 1

An embodiment of an X-ray exposure apparatus according to the present invention will now be described.

Figure 1:
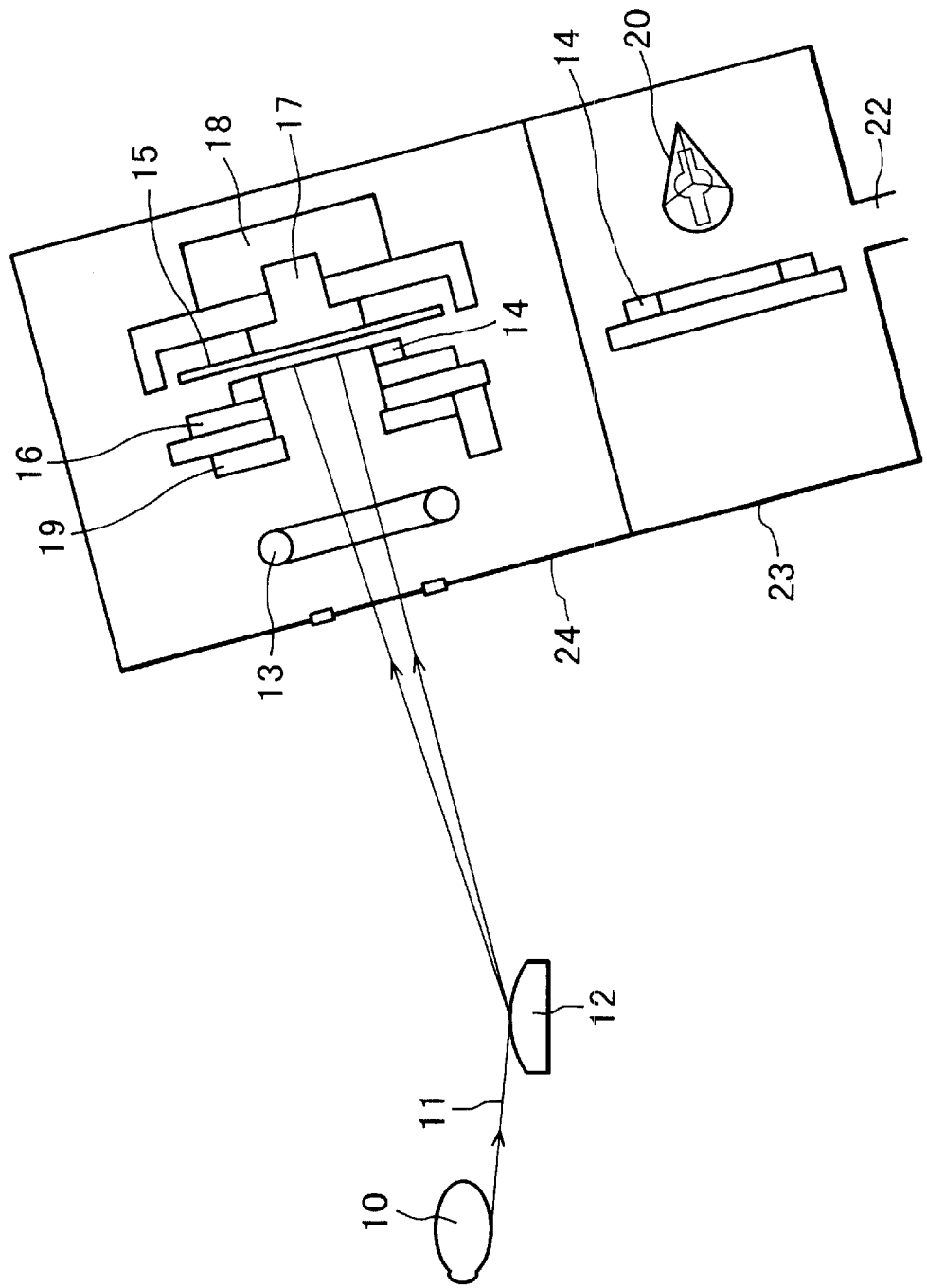
FIG. 1 is a schematic view of an exposure apparatus according to a first embodiment of the present invention.
Figure 2:
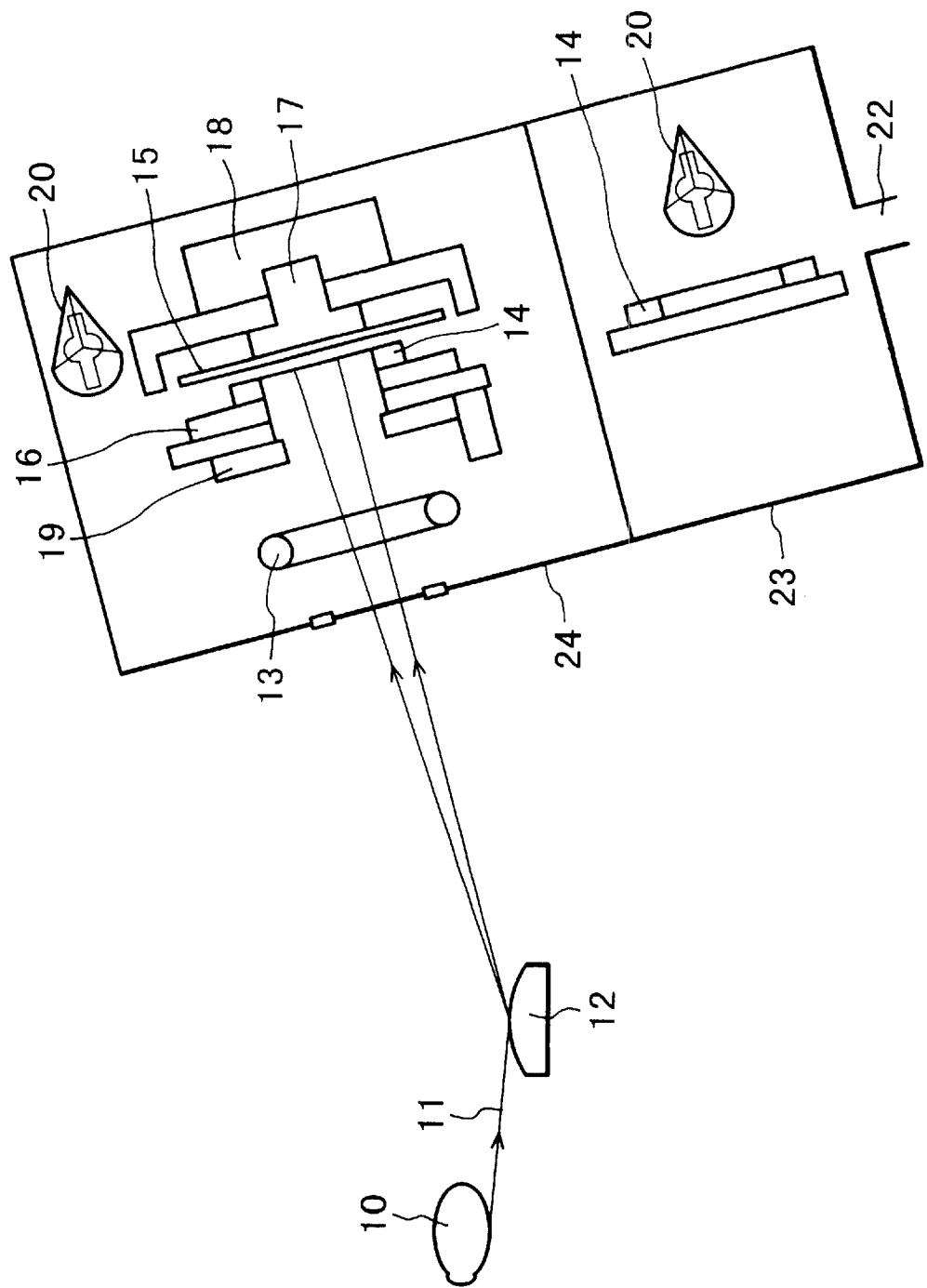
FIG. 2 is a schematic view of an exposure apparatus according to a modified example of the embodiment of FIG. 1.

FIG. 1 is a schematic view of a main portion of an exposure apparatus according to a first embodiment of the present invention, and FIG. 2 is a schematic view of a similar exposure apparatus, corresponding to a modified example of the FIG. 1 embodiment. The X-ray exposure apparatus of this embodiment uses synchrotron radiation (SR) light as an X-ray light source. It includes an exposure chamber 24 and a mask cassette chamber, if desired, which is not shown. It also includes a unit 23 which provides an auxiliary chamber. In the example shown in FIG. 1, only the unit 23 is provided with an auxiliary light source 20. In the example shown in FIG. 2, on the other hand, both of the exposure chamber 24 and the unit 23 are provided with an auxiliary light source 20. Thus, in the example of FIG. 2, the exposure chamber 24 can function as a first auxiliary chamber, while the unit 23 can function as a second auxiliary chamber.

Denoted at 10 is a synchrotron radiation (SR) light source (accumulation ring) which produces a synchrotron radiation (SR) beam 11. The radiation beam 11 emitted from the SR light source 10 has a sheet-like beam shape, being elongated in a lateral direction with a uniform intensity and having substantially no expansion in a vertical direction. The radiation beam 11 is reflected by a cylindrical mirror 12 by which it is expanded in the vertical direction, such that a beam of an approximately rectangular sectional shape for illuminating a rectangular exposure region is produced. The thus expanded radiation beam 11 is adjusted by a shutter 13, so that a uniform exposure amount is provided within a region to be irradiated. The radiation beam 11 passing the shutter 13 is directed to an X-ray mask 14, which is held by attraction upon a mask stage 16, at a position to be opposed to a wafer 15.

Denoted at 15 is a wafer which is going to be exposed. The wafer 15 is held by a wafer chuck 17 which is mounted on a wafer stage 18. By moving the wafer stage 18, the wafer 15 can be positioned.

There is an alignment unit 19 which comprises an optical system for detecting alignment marks formed on the mask 14 and the wafer 15, respectively, and computing means for calculating a relative deviation between them. With this alignment unit, high precision alignment can be accomplished.

After alignment between the X-ray mask 14 and the wafer 15 is accomplished, a pattern formed on the X-ray mask 14 is lithographically transferred to the wafer 15, in accordance with a step-and-repeat method or a scanning method.

Details of an X-ray mask 15 will be described with reference to FIGS. 3 and 4. The X-ray mask structure comprises a holding frame 1 made of Si and having a thickness of 2 mm, an X-ray transmissive supporting film 2 being made of SiC and formed by CVD to a thickness of 2.0 microns, an X-ray absorptive material 3 made of W, and a reinforcing member 4 being made of Pyrex glass and adhered to the holding frame 1 by anodic bonding.

A titanium oxide material 6 (photocatalyst) is formed with a thickness of 1,000 nm, by applying alkyl titanate to a peripheral portion of a mask (outside an exposure region) and the reinforcing member 4 and by sintering it. The titanium oxide material 6 on the reinforcing member 4 may be provided by applying a titanium oxide powder by use of a binder agent such as Teflon (trademark). Alternatively, in order to avoid mutual influence of the reinforcing member 4 and the titanium oxide 6, a separation film (not shown) of $SiO_2$, for example, may be formed on the reinforcing member 4.

In the X-ray exposure region of the mask of this embodiment, there is no titanium oxide layer formed. By forming the layer in a region outside the exposure region, it can be formed with a sufficient film thickness, enough for reaction, and without a possibility of attenuation of X-rays due to absorption by the titanium oxide or of a change of titanium oxide due to X-rays.

The X-ray exposure process can be performed by use of a mask such as described above. In the example of FIG. 2, there is an auxiliary light source 20 inside the exposure chamber 24, which is placed juxtaposed to the mask stage 16. This auxiliary light source may use ultraviolet rays, vacuum ultraviolet rays or X-rays. Thus, within a range not adversely affecting the wafer 15, auxiliary light can be projected to the X-ray mask 14 from the auxiliary light source 20. Specifically, the auxiliary light source 20 inside the exposure chamber 24 may comprise a Hg lamp, a black light, a laser, or laser plasma generated X-rays.

In the exposure apparatus of FIG. 2, by irradiation of the mask 14 with auxiliary light inside the exposure chamber 24, and through decomposition of any deposited materials or an anti-charging effect, deposition of particles or the like can be prevented to some degree. However, if the X-ray transmissivity or the transmissivity to laser light used for the alignment operation decreases due to any depositions, the exposure process may be interrupted, and the mask 14 may be moved into the unit 23. Then, light from the auxiliary light source 20 may be projected thereto. Similarly, in the exposure apparatus of FIG. 1, if the X-ray transmissivity or the transmissivity to laser light used for the alignment operation decreases due to any depositions, the exposure operation may be interrupted, and the mask 14 may be moved into the unit 23. Then, light from the auxiliary light source 20 may be projected thereto. The level for deterioration or attenuation of X-rays or alignment light, for execution of exposure interruption, may be determined in accordance with the precision required for a workpiece to be exposed.

The inside of exposure chamber 24 is controlled to a vacuum ambience or a light element ambience such as He, for example. The water content is controlled to a ppm order or less. As regards the unit 23, on the other hand, except the water content, it is controlled under similar conditions as those of the exposure chamber. Only the water content is controlled to a humidity of 1–90%, preferably, 4–80%. Further, there is an exhaust port for discharging contaminated gases. In the examples of FIGS. 1 and 2, there is a partition wall between the exposure chamber 24 and the unit 23. However, it may be omitted in a case where differential gas exhaustion, for example, is performed so that any influence to the exposure process can be prevented thereby. The auxiliary light source 20 in the unit 23 may comprise a Hg lamp, a black light, a xenon lamp, a laser or laser plasma generated X-rays.

The titanium oxide produces a photocatalytic function in response to absorption of light of short wavelengths of 380 nm or lower. In a range not longer than 380 nm, use of a longer wavelength is preferable because the absorption efficiency is higher. Therefore, use of a Hg lamp, black light, xenon lamp or laser, which produces many rays of 350–380 nm, is effective.

Decomposition of deposition due to the photocatalytic function will now be described in detail. In response to absorption of light energies by a photocatalyst, electrons and positive holes are produced. The electrons and positive holes then react with water, whereby hydroxy-radicals (•OH) or super-oxide ions ($O_2^-$) are produced. These radicals or ions serve to decompose the deposition such as organic materials. Therefore, if the water content is low (low humidity), the reactions become slow. If, however, the humidity is too high, water condensation or the like will adversely influence the maintenance of the apparatus.

The exhaust port 22 functions to discharge decomposition products of depositions, outwardly, and it accelerates the reaction. Also, it is effective to re-deposition of intermediate matters of decomposition.

Electrons produced from a photocatalyst are transferred to an electrically conductive material and, due to a reducing action, any depositions upon the surface of the electrically conductive material can be decomposed. This is effective also to prevent recombination of produced electrons and positive holes, to increase the efficiency. The SiC film used in this embodiment as the supporting film 2 has a small electrical conductivity. Therefore, a conductive film 7 may not be provided as shown in FIG. 3, or it may be provided as shown in FIG. 4. As regards the conductive film 7, a film of noble metal such as Au or a metal oxide such as ITO may be formed with a thickness of a few nanometers or less.

However, if no conductive film is used, the absorptive material 3 made of metal (electrically conductive material) may preferably be in contact with the photocatalyst 6. Using (or not using) a conductive film may be determined in accordance with the ratio in area between the X-ray absorbing portion and the X-ray transmitting portion of the exposure region. By irradiating a photocatalyst provided outside the exposure region with auxiliary light, not only can depositions on the photocatalyst surface, but also depositions on the surfaces of the supporting film and the absorptive material, inside the exposure region, be decomposed.

With an exposure apparatus having a unit 23 for cleaning a mask through a photocatalytic action, as of this embodiment, an X-ray exposure process that can meet mass-production can be performed.

EXAMPLE 2

An X-ray exposure apparatus according to another embodiment of the present invention will be described.

Figure 5:
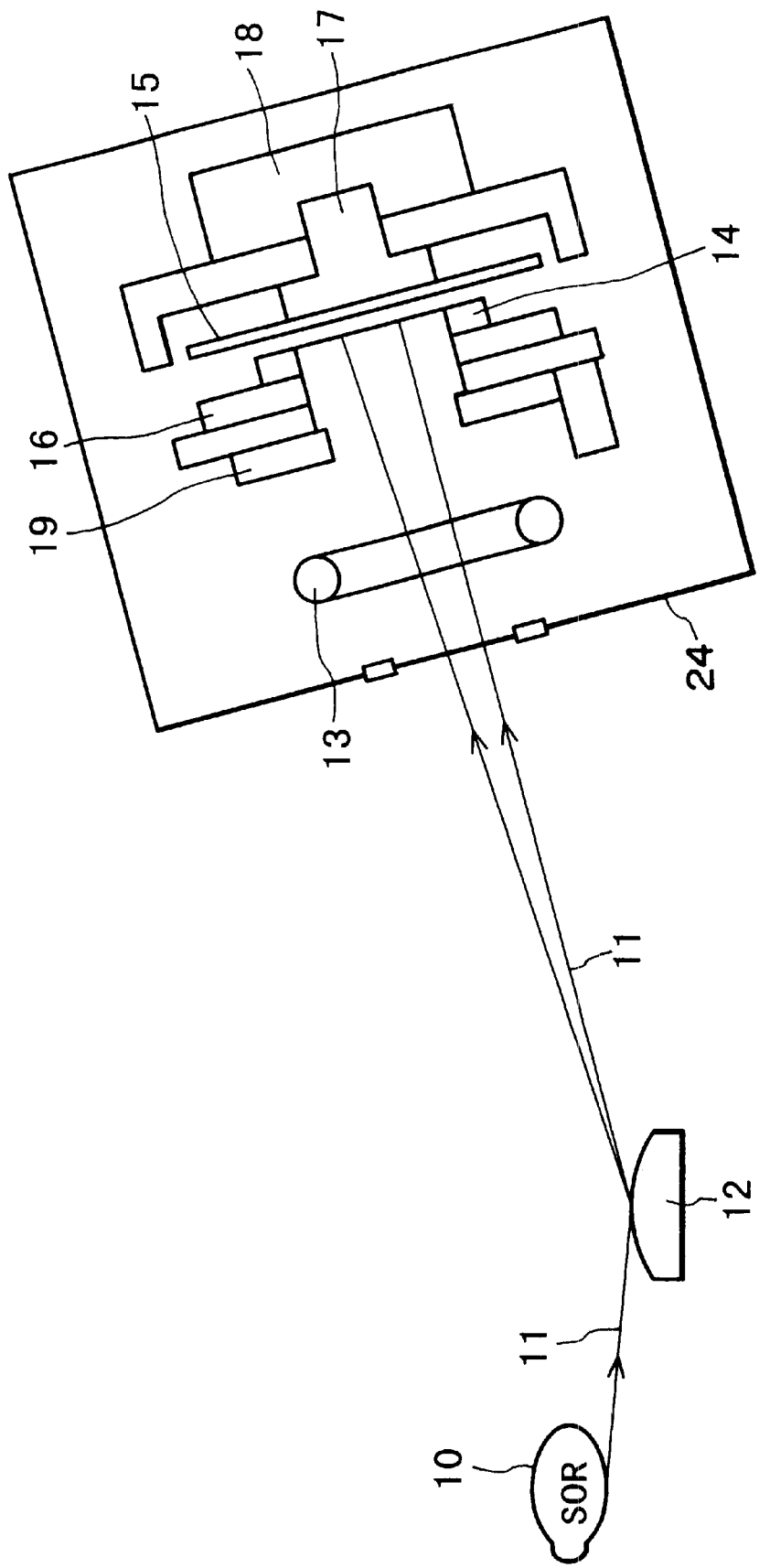
FIG. 5 is a schematic view of an exposure apparatus according to a further embodiment of the present invention.
Figure 6:
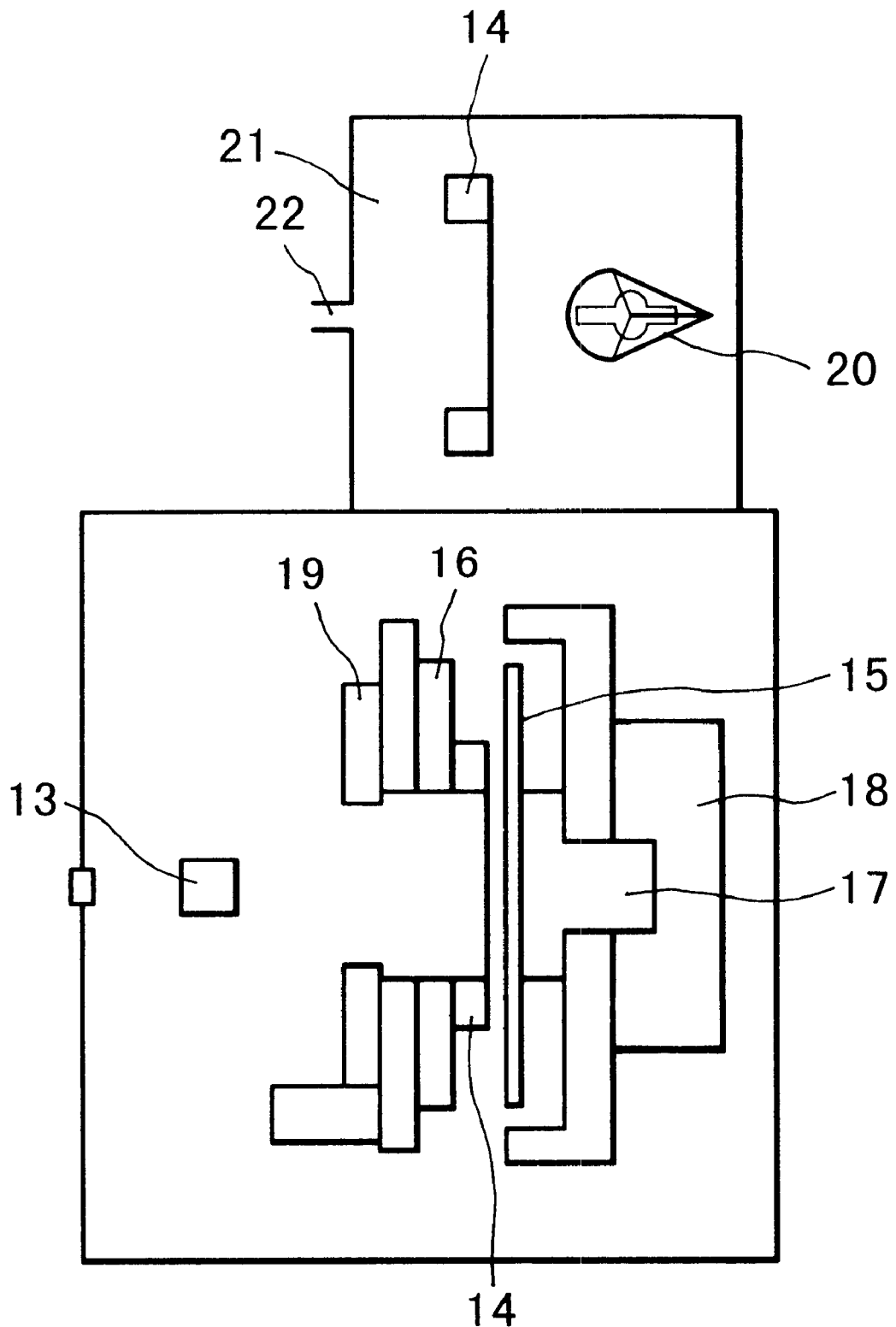
FIG. 6 is a top plan view of the exposure apparatus of FIG. 5.

FIG. 5 is a schematic view of a main portion of an exposure apparatus according to a second embodiment of the present invention. FIG. 6 is a plan view of the exposure apparatus of FIG. 5, as viewed from above.

The inside structure of an exposure chamber 24 is similar to that of the first embodiment. It may include an auxiliary unit, as shown in FIG. 1 or 2.

Details of an X-ray mask will be explained with reference to FIG. 7. The X-ray mask structure comprises a holding frame 1 made of Si and having a thickness of 2 nm, an X-ray transmissive supporting film 2 being made of SiN and formed by CVD to a thickness of 2.0 microns, an X-ray absorptive material 3 made of Ta and formed by sputtering, and a reinforcing member 4 being made of SiC and adhered to the holding frame 1 by an adhesive agent 5. A titanium oxide material 6 (photocatalyst) is provided by vapor deposition, after formation of the absorptive material 3. During film formation of the titanium oxide 6 based on sputtering, a mesh may be used to provide a directionality. Since there is no titanium oxide on the side faces of the absorptive material 3, the linewidth control for the absorptive material 3 is easy.

In the X-ray exposure apparatus of this embodiment, as shown in FIG. 6, there is an auxiliary light source 20 which is disposed inside a mask cassette chamber 21 (auxiliary chamber) for accommodating a mask therein during a non-exposure period. As regards the mask cassette chamber 21, except the water content, it is controlled under similar conditions as those of the exposure chamber 24. Only the water content is controlled to a humidity of 1–90%, preferably, 4–80%. Further, there is an exhaust port formed. The auxiliary light source 20 may comprise a Hg lamp, a black light, a xenon lamp, a laser or laser plasma generated X-rays. By use of light of efficient wavelengths and an appropriate water content, the reaction speed increases. The provision of the exhaust port 22 is effective to discharge contaminated gases, containing decomposition products of depositions, outwardly, to thereby accelerate the reaction and also to prevent re-deposition of intermediate matters of the decomposition products. It is to be noted that the function of titanium oxide continues even under normal chamber illumination (e.g., from a fluorescent lamp).

Figure 7:
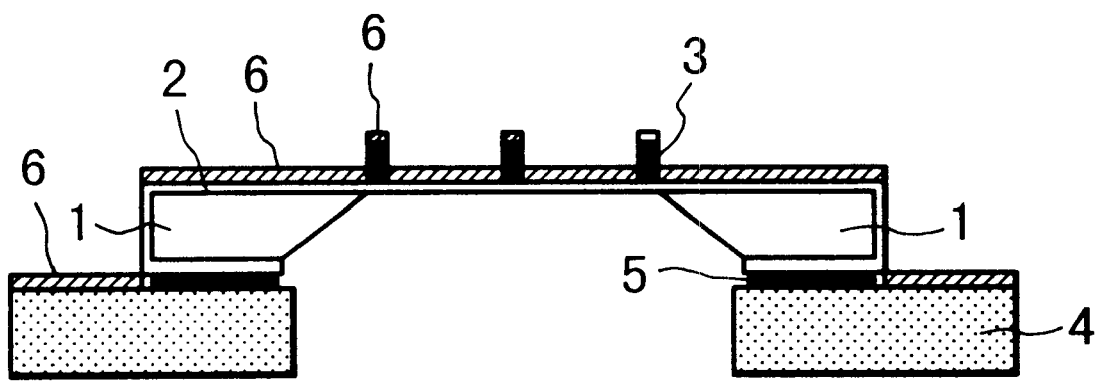
FIG. 7 is a sectional view of a mask structure according to another embodiment of the present invention.

In the mask structure shown in FIG. 7, a photocatalyst is provided also in an exposure region. Therefore, not only during an X-ray exposure process but also in the mask cassette chamber, the mask cleaning based on the photo-catalytic action can be performed. Further, because the photocatalyst becomes electrically conductive in response to irradiation with the auxiliary light, deposition of particles upon the mask can be prevented effectively. With an exposure apparatus such as described above, an X-ray exposure process that can meet mass-production can be performed.

Figure 3:
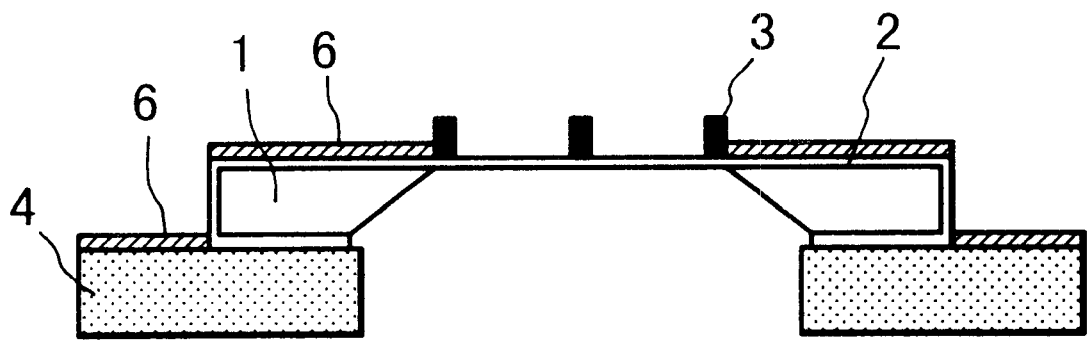
FIG. 3 is a sectional view of a mask structure according to an embodiment of the present invention.
Figure 4:
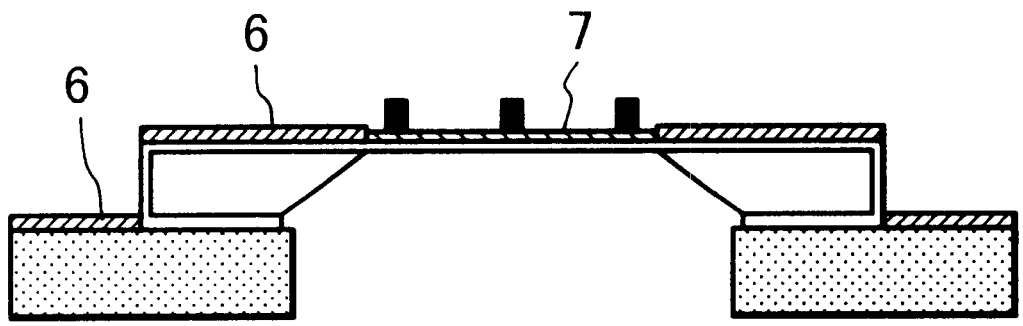
FIG. 4 is a sectional view of a mask structure according to a modified example of the embodiment of FIG. 3.

It is to be noted that the exposure apparatus of this embodiment may use a mask structure such as shown in FIG. 3 or 4, and similarly, the exposure apparatus of the first embodiment may use a mask structure such as shown in FIG. 7.

EXAMPLE 3

Figure 8:
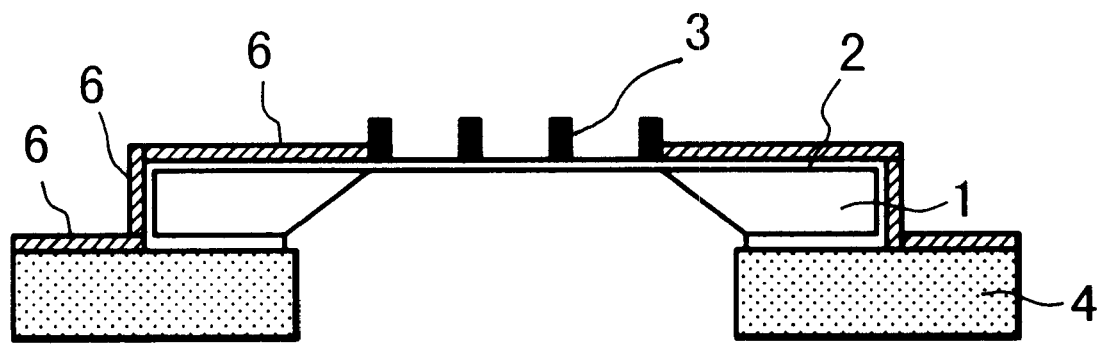
FIG. 8 is a sectional view of a mask structure according to a further embodiment of the present invention.

FIG. 8 is a sectional view of a mask structure according to a third embodiment of the present invention. The mask structure of this embodiment may be used either in an X-ray exposure apparatus having a unit, as in the first embodiment, or in an X-ray exposure apparatus having a mask cassette chamber as in the second embodiment. Further, it may be used in an X-ray exposure apparatus having both a unit and a mask cassette chamber.

The X-ray mask structure comprises a holding frame 1 made of Si and having a thickness of 2 mm, an X-ray transmissive supporting film 2 being made of C (diamond) and formed by CVD to a thickness of 2.0 microns, an X-ray absorptive material 3 made of W, and a reinforcing member 4 being made of Pyrex glass and adhered to the holding frame 1 by anodic bonding.

There is a titanium oxide film 6 (photocatalyst) which is formed on a peripheral portion of the mask (outside an exposure region) and the reinforcing member 4, through resistance heating, EB vapor deposition or sputtering, for example. In order to avoid mutual influence between the reinforcing member 4 and the titanium oxide film 6, a separation film (not shown) made of $SiO_2$, for example, may be provided. To this titanium oxide film 6, Cr may be ion-injected by $2\times10^{-6}$ mol/g. By this, the absorption wavelength of the titanium oxide may be prolonged to about 450 nm, such that a longer wavelength (providing a higher absorption efficiency) can be used and, therefore, the efficiency can be increased. Further, the types of usable light sources become wider. A white bulb such as a halogen lamp may be used, for example. When a xenon lamp or Hg lamp is used, light of 380 nm or more can be used. Therefore, the lamp utilization efficiency is high. Generally, the usable wavelength becomes longer with a larger Cr ion injection amount. Thus, the injection amount may be adjusted in accordance with a lamp to be used. As regards, a metal to be injected, V may be used, for example.

The film of C (diamond) used in this embodiment as a mask supporting film 2 has an electrical conductivity. Thus, by irradiating a titanium oxide provided outside the exposure region with an auxiliary light source, not only can depositions on the surface of the titanium oxide but also depositions on the surfaces of the supporting film and the absorptive material, inside the exposure region, to which electrons are transferred, be decomposed.

By injection of a metal such as Cr into titanium oxide, the wavelength to be absorbed can be longer, causing an increase in the reaction efficiency and the lamp efficiency. Through decomposition action and anti-electrification action of photocatalyst, deposition of particles on the mask can be prevented effectively. When such a mask is used with an X-ray exposure apparatus of the first or second embodiment, a high precision X-ray exposure process which meets mass-production can be accomplished.

Figure 9:
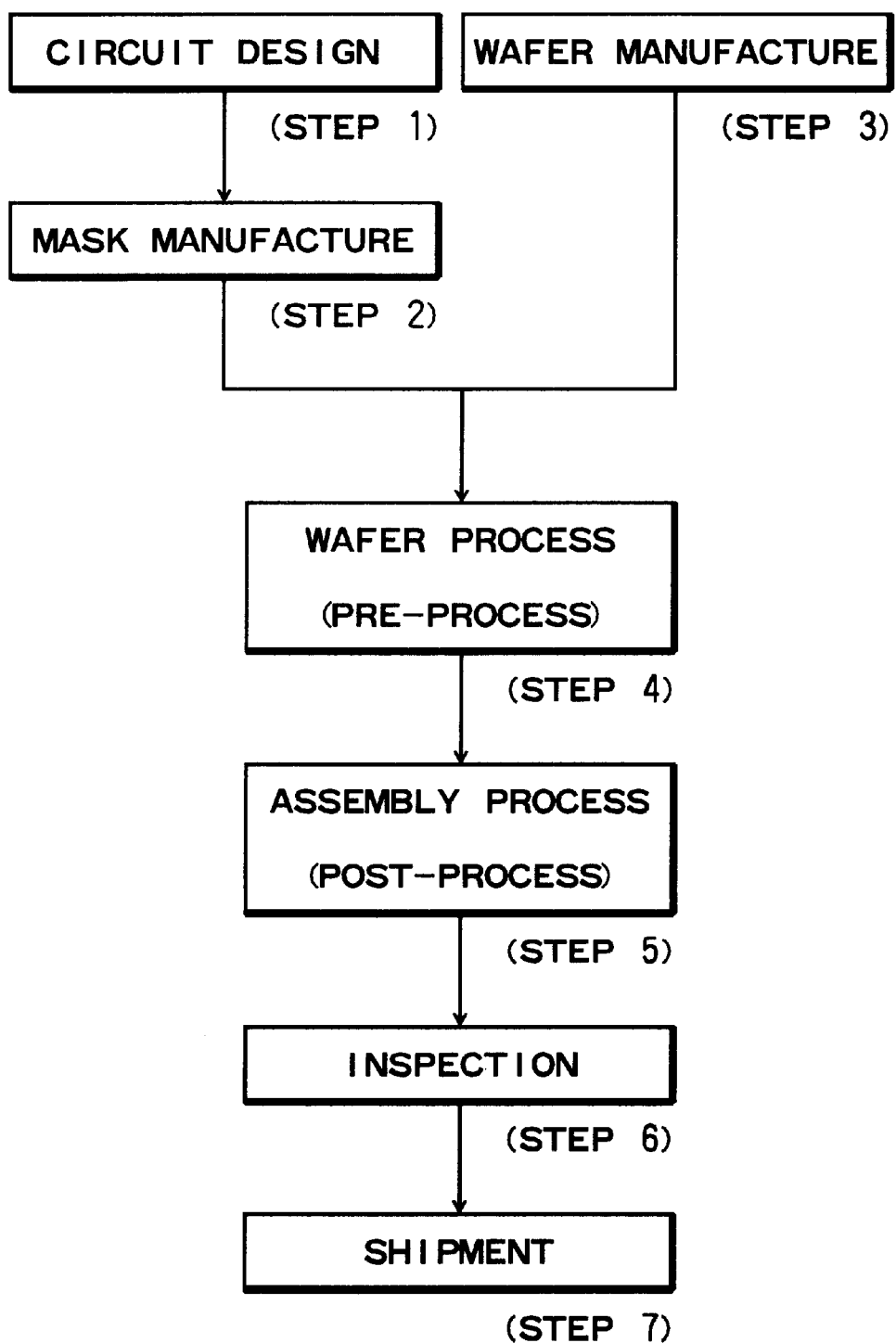
FIG. 9 is a flow chart of semiconductor device manufacturing processes, using an exposure apparatus according to the present invention.

FIG. 9 is a flow chart of a procedure for the manufacture of microdevices such as semiconductor chips (e.g., Ics or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so-prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 10:
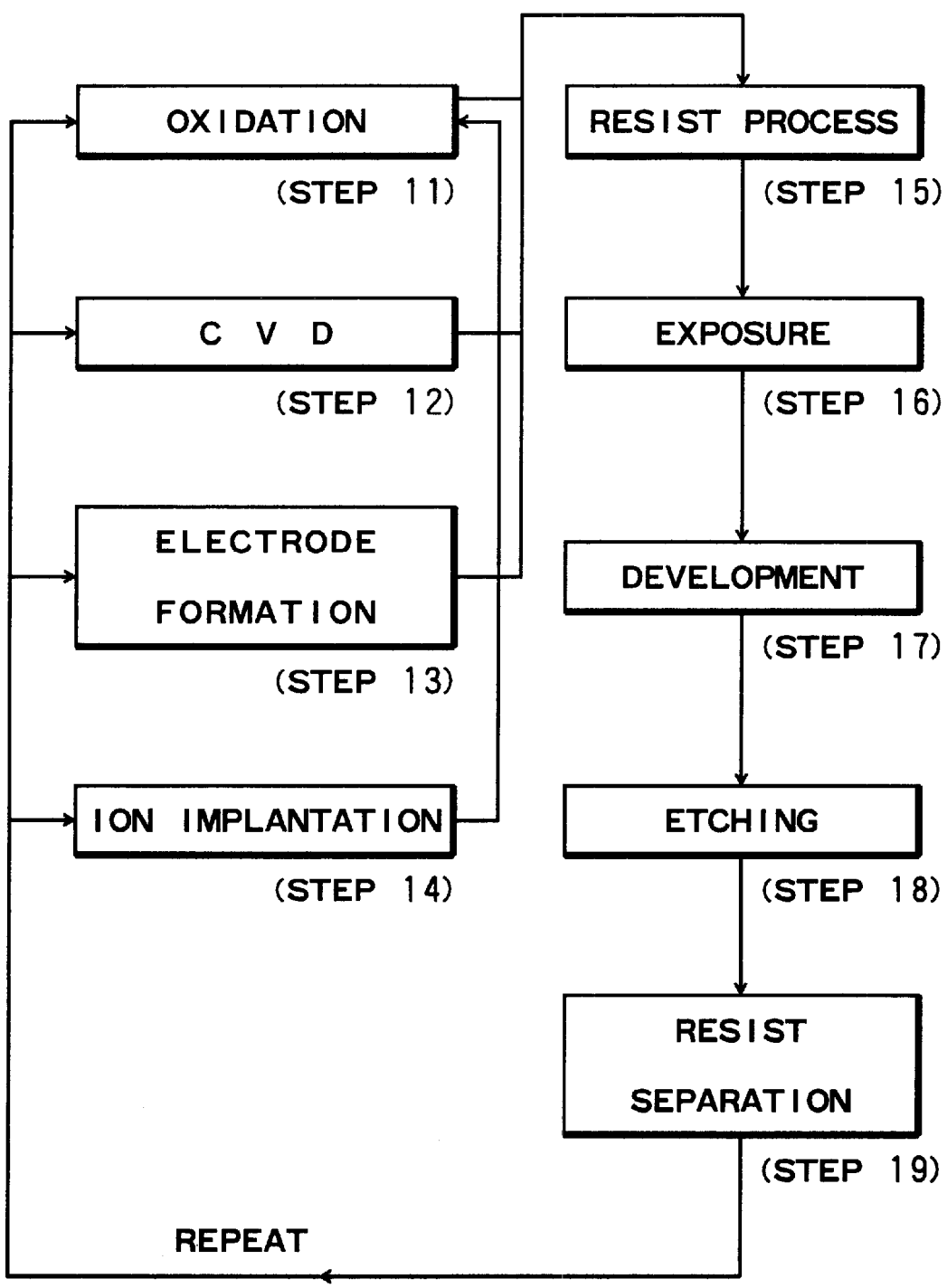
FIG. 10 is a flow chart for explaining details of a wafer process in the procedure of the flow chart of FIG. 9.
Figure 11:
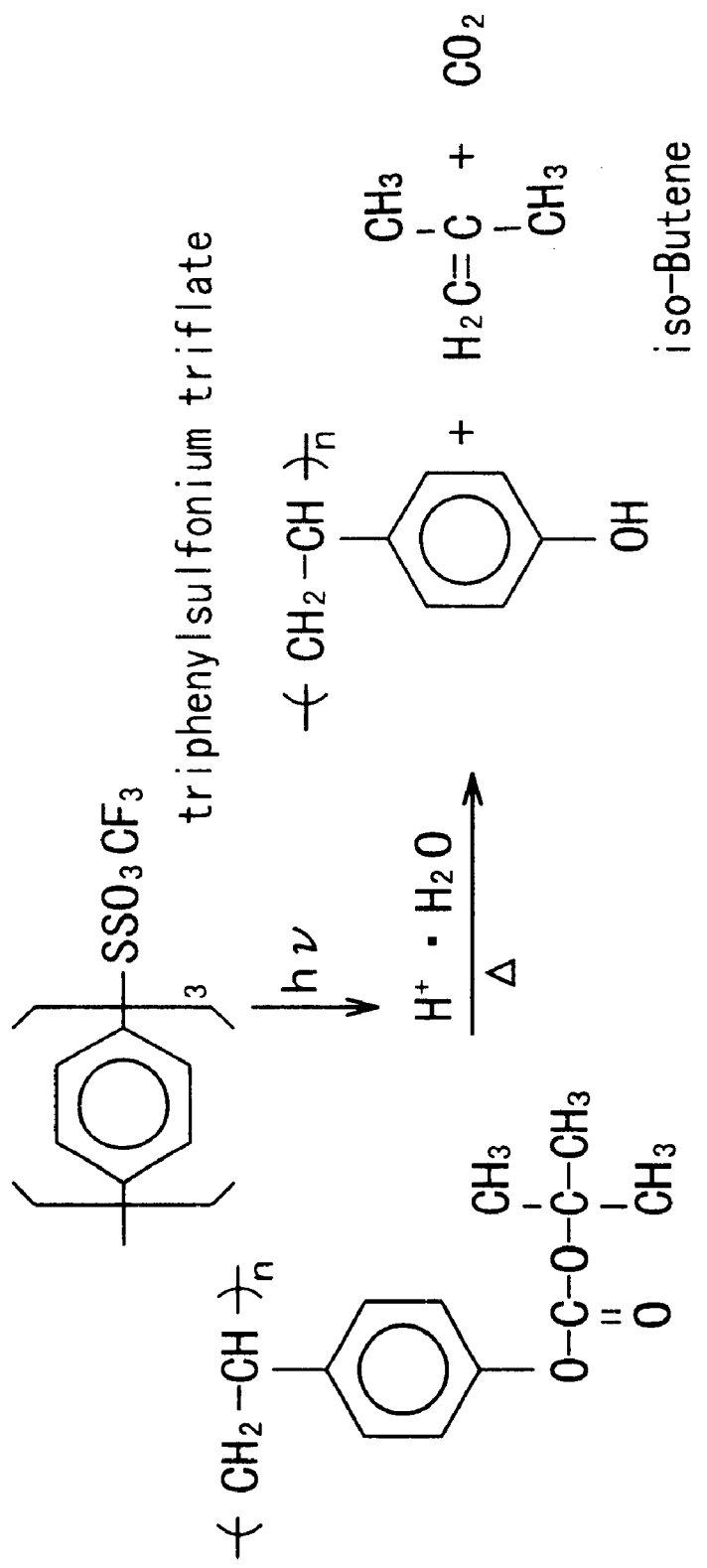
FIG. 11 is a schematic view for explaining a reaction of a chemical amplification type resist.

FIG. 10 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus or method described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

Although the invention has been described mainly with reference to examples for the manufacture of semiconductor devices through an X-ray exposure process, the present invention is not limited to this. Provided that light of a wavelength with respect to which a photocatalyst is functional is used, the present invention is applicable also to an exposure method, an exposure apparatus or a mask structure in a case where light rays other than X-rays (e.g., ultraviolet rays or vacuum ultraviolet rays) are used as exposure light and/or auxiliary light. Namely, an exposure process wherein ultraviolet rays or vacuum ultraviolet rays from a light source such as an excimer laser, for example, an X-ray exposure process wherein a transmission type or reflection type mask (or a reflection optical system) is used, and an exposure process based on an electron beam or ion beam, all can be done within the scope of the present invention.

Also, while titanium oxide is referred to as an example of a photocatalyst, a different photocatalyst may of course be used. Examples are a metal oxide such as ZnO, $Nb_2O_5$, $WO_3$, $SnO_2$ or $ZrO_2$; a compound metal oxide such as $SrTiO_3$ or $Ni-K_4Nb_6O_{17}$; a metal sulfide such as CdS or ZnS; or a metal chalcogenide such as CdSe, GaP, CdTe, $MoSe_2$ or $WSe_2$.

As described, an exposure apparatus for transferring a desired pattern to a workpiece through an exposure process is provided with a unit for projection of auxiliary light and a control system for precisely controlling the humidity inside the unit, by which a satisfactory cleaning process can be done to a mask. For example, contamination of a mask may be detected and, when it reaches a predetermined level, the mask may be moved into the unit for acceleration of the decomposition action. The cleaning operation may be done repeatedly and frequently.

The exposure apparatus may be provided with a mask cassette chamber for storing a mask therein during a period in which no exposure is made to a workpiece. The mask cassette chamber may be provided with a light source best suited to the photocatalytic action as well as an environment therefore. This enables a mask cleaning operation when the mask is not used, and it effectively prevents mask contamination.

In accordance with the present invention, the necessity of a mask cleaning operation can be reduced or removed and, therefore, the lifetime of each mask can be prolonged. Further, production of non-uniform exposure, deterioration of exposure amount control, or degradation of alignment precision due to a decrease of alignment light transmissivity, can be avoided. As a result, high precision printing can be accomplished in mass-production order. Furthermore, by printing a pattern onto workpieces through an exposure process using an exposure apparatus of the present invention, mass-production of high performance semiconductor devices can be accomplished.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   an exposure system for executing an exposure operation by use of an exposure beam to transfer a pattern of a mask onto a substrate, the mask having a photocatalyst portion;
   an auxiliary space for irradiating therewithin, the mask with an auxiliary radiation different from the exposure beam, to accelerate a photocatalytic reaction of the photocatalyst portion; and
   humidity control means for controlling humidity inside said auxiliary space.

2. An apparatus according to claim 1, further comprising an exposure space for executing the exposure operation therewithin.

3. A method according to claim 1, further comprising a mask storing space for keeping therein the mask during a non-exposure period.

4. An apparatus according to claim 3, wherein said mask storing space is different from said auxiliary space, and wherein said apparatus further comprises an exposure space, an auxiliary light source for irradiating the mask kept in said auxiliary space, and second control means for controlling humidity of said mask storing space independently of said exposure space.

5. An apparatus according to claim 3, wherein said mask storing space functions also as said auxiliary space, and wherein said apparatus further comprises an exposure space, an auxiliary light source for irradiating the mask kept in said mask storing space, and second control means for controlling humidity of said mask storing space independently of said exposure space.

6. An apparatus according to claim 2, wherein said exposure space functions as said auxiliary space, and wherein said apparatus further comprises an auxiliary light source for irradiating the mask kept in said exposure space.

7. An apparatus according to claim 2, wherein said exposure space and said auxiliary space are separated from each other by one of a wall and a differential exhausting system.

8. An apparatus according to claim 1, wherein said humidity control means controls the humidity in said auxiliary space in a range of 1–90%.

9. An apparatus according to claim 1, wherein said humidity control means controls the humidity in said auxiliary space in a range of 4–80%.

10. An apparatus according to claim 1, wherein the auxiliary radiation comprises one of an ultraviolet ray, an extreme ultraviolet ray and an X-ray.

11. An apparatus according to claim 1, wherein the exposure beam comprises one of an extreme ultraviolet ray and an X-ray.

12. An apparatus according to claim 1, wherein the mask has the photocatalyst portion doped with metal.

13. An apparatus according to claim 12, wherein the metal is one of Cr and V.

14. An apparatus according to claim 1, further comprising an exhaust port communicated with said auxiliary space.

15. An apparatus according to claim 1, wherein the mask comprises one of a transparent type mask and a refractive type mask.

16. A device manufacturing method, comprising the steps of:
    executing an exposure operation by use of an exposure beam to transfer a pattern of a mask onto a substrate, the mask having a photocatalyst portion;
    irradiating, in an auxiliary space, the mask with an auxiliary radiation different from the exposure beam to accelerate photocatalytic reaction of the photocatalyst portion; and
    controlling the humidity inside the auxiliary space.

17. A method according to claim 16, wherein the humidity in the auxiliary space is controlled in a range of 1–90%.

18. A method according to claim 16, wherein the humidity in the auxiliary space is controlled in a range of 4–80%.

19. A method according to claim 16, wherein the auxiliary radiation comprises one of an ultraviolet ray, an extreme ultraviolet ray and an X-ray.

20. A method according to claim 16, wherein the exposure beam comprises one of an extreme ultraviolet ray and an X-ray.

21. A method according to claim 16, further comprising exhausting an inside gas of the auxiliary space.

22. A method according to claim 16, further comprising conveying the mask from an exposure space into the auxiliary space for the irradiation of the same with the auxiliary radiation when contamination of the mask reaches a predetermined level.

23. A method according to claim 16, further comprising conveying the mask from an exposure space into said auxiliary space for irradiation of the same with the auxiliary radiation when a transmittancy of the mask is reduced.

24. A method according to claim 16, wherein the mask comprises one of a transparent type mask and a refractive type mask.

25. A method according to claim 16, further comprising producing a semiconductor device by use of the exposed substrate.

* * * * *

UNITED STATES PATENT AND TRADEMARK OFFICE
CERTIFICATE OF CORRECTION

PATENT NO.    : 6,449,332 B1
DATED         : September 10, 2002
INVENTOR(S)   : Keiko Chiba It is certified that error appears in the above-identified patent and that said Letters Patent is hereby corrected as shown below:

<u>Column 2,</u>
Line 36, "mark" should read -- mask --.

<u>Column 3,</u>
Line 5, "of itself" should read -- itself --.

<u>Column 6,</u>
Line 8, "effective to" should read -- effective to prevent --.

<u>Column 8,</u>
Line 3, "regards," should read -- regards --.
Line 17, the first occurrence of "of" should read -- of a --.

Signed and Sealed this

Eighteenth Day of February, 2003

JAMES E. ROGAN
*Director of the United States Patent and Trademark Office*